(12) United States Patent
Lee et al.

(10) Patent No.: US 7,531,446 B2
(45) Date of Patent: May 12, 2009

(54) METHOD OF MANUFACTURING A SEMICONDUCTOR DEVICE

(75) Inventors: Yong-Woo Lee, Anyang-si (KR); Kuk-Han Yoon, Yongin-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 114 days.

(21) Appl. No.: 11/418,067

(22) Filed: May 5, 2006

(65) Prior Publication Data

US 2006/0258145 A1    Nov. 16, 2006

(30) Foreign Application Priority Data

May 10, 2005    (KR) ...................... 10-2005-0038713

(51) Int. Cl.
  *H01L 21/4763*    (2006.01)
(52) U.S. Cl. .................. 438/622; 438/638; 438/668
(58) Field of Classification Search ................ 438/618, 438/396, 253, 622, 638, 639, 666, 668, 672
See application file for complete search history.

(56) References Cited

U.S. PATENT DOCUMENTS

| 5,270,238 | A  | * | 12/1993 | Kim ........................... 438/253 |
| 6,156,636 | A  | * | 12/2000 | Yeom et al. .................. 438/618 |
| 6,255,160 | B1 | * | 7/2001  | Huang ......................... 438/253 |
| 6,391,736 | B1 | * | 5/2002  | Uh et al. ..................... 438/396 |
| 6,924,529 | B2 | * | 8/2005  | Kim et al. .................... 257/334 |
| 7,074,717 | B2 | * | 7/2006  | Rhodes ........................ 438/639 |
| 2002/0106856 | A1 | * | 8/2002 | Lee et al. ..................... 438/255 |
| 2003/0162353 | A1 | * | 8/2003 | Park .......................... 438/253 |

FOREIGN PATENT DOCUMENTS

| KR | 10-0356776 | 10/2002 |
| KR | 10-0434505 | 5/2004 |
| KR | 10-0468784 | 1/2005 |

* cited by examiner

*Primary Examiner*—Kevin M Picardat
(74) *Attorney, Agent, or Firm*—Harness, Dickey & Pierce, PLC

(57) ABSTRACT

A method of manufacturing a semiconductor device may involve providing a first insulation pattern on a substrate including first and second regions. The first insulation pattern may include a first contact hole for exposing the first region. A spacer may be provided on a sidewall of the first insulation pattern. A conductive pattern may be provided in the first contact hole such that a top surface of the conductive pattern is lower than a top surface of the first insulation pattern. A second insulation pattern may be provided on the conductive pattern. The first insulation pattern may be etched using the second insulation pattern and the spacer as a self-aligning mask to form a second contact hole for exposing the second region. A wiring may be provided in the second contact hole.

21 Claims, 17 Drawing Sheets

METHOD OF MANUFACTURING A SEMICONDUCTOR DEVICE

PRIORITY STATEMENT

This application claims priority under 35 USC § 119 from Korean Patent Application No. 2005-38713 filed on May 10, 2005, the contents of which are herein incorporated by reference in their entirety.

BACKGROUND

1. Field of the Invention

Example embodiments of the present invention relate to methods of manufacturing semiconductor devices. More particularly, example embodiments of the present invention relate to methods of manufacturing semiconductor devices that may include conductive layer patterns.

2. Description of the Related Art

Semiconductor devices may have integrated cells in a chip to increase data transfer rates of the semiconductor devices.

Various attempts may have been pursued to improve the integration of semiconductor devices. As semiconductor devices become more integrated, wirings of the semiconductor devices may be provided as multi-layered structures.

Moreover, as semiconductor devices become more integrated, a distance between the wirings of the semiconductor devices may decrease, and misalignments may occur during a photolithographic process that may be implemented to form a contact hole. The contact hole may expose an insulating interlayer that may be provided between conductive layer patterns. A self-aligned process may have been recently implemented to form the contact hole in an effort to improve the misalignment during the photolithographic process. In the self-aligned process, a spacer may be formed on a sidewall of the conductive layer patterns and then the contact hole may be formed by the photolithographic process.

Although the conventional techniques are generally thought to provide acceptable results, they are not without shortcomings. For example, when a distance between the conductive layer patterns is reduced, a thickness of the spacer formed on a sidewall of the conductive layer pattern (which is called a shoulder margin) may also be reduced. Accordingly, the shoulder margin of the spacer may be decreased as the integration degree of a semiconductor device increases. The spacer may be damaged in the photolithographic process due to the small shoulder margin, and this may cause a breakdown voltage between a contact pad in the contact hole and a bit line to decrease.

If a thickness of the spacer is increased so the shoulder margin of the spacer is sufficiently large, voids may be generated in the portion of the insulation layer existing in a gap space between the bit lines including the spacer.

SUMMARY

According to an example, non-limiting embodiment, a method may involve providing a first insulation layer pattern on a substrate. The first insulation layer pattern may include a first contact hole through which a first region of the substrate is exposed. A spacer may be provided on a sidewall of the first insulation layer pattern. A conductive layer pattern may be provided in the first contact hole such that a top surface of the conductive layer pattern may be lower than a top surface of the first insulation layer pattern. A second insulation layer pattern may be provided on the conductive layer pattern in the first contact hole. A second contact hole may be provided on the substrate by etching the first insulation layer pattern using the second insulation layer pattern and the spacer as a self-aligning mask. The second contact hole may expose a second region of the substrate. A wiring may be provided in the second contact hole by filling the second contact hole with a conductive material. The wiring may be electrically connected to the substrate.

According to another example, non-limiting embodiment, a method may involve providing an oxide layer pattern having a first etching rate on a substrate. The substrate may include an insulating interlayer that covers a contact pad. The oxide layer pattern may include a first contact hole. A width of a lower portion of the oxide layer pattern may be greater than a width of an upper portion of the oxide layer pattern. A spacer may be provided on a sidewall of the oxide layer pattern. The spacer may have a second etching rate lower than the first etching rate. A bit line may be provided on the insulating interlayer in the first contact hole. A top surface of the bit line may be lower than a top surface of the oxide layer pattern. A mask pattern may be provided on the bit line in the first contact hole. The mask pattern may have a third etching rate lower than the first etching rate. A second contact hole may be provided, through which the contact pad may be exposed, by sequentially etching the oxide layer pattern and the insulating interlayer using the spacer and the mask pattern as a self-aligning mask. A wiring may be provided in the second contact hole by filling the second contact hole with a conductive material. The wiring may be electrically connected to the contact pad.

According to another example, non-limiting embodiment, a method may involve providing a first insulation layer pattern on a substrate. The first insulation layer pattern may include a first contact hole through which the substrate may be exposed. A spacer may be provided on a sidewall of the first insulation layer pattern. A conductive layer pattern may be provided in the first contact hole. A second insulation layer pattern may be provided in the first contact hole and on top of the conductive layer pattern. The first insulation layer pattern maybe etched using the second insulation layer pattern and the spacer as a self-aligning mask to provide a second contact hole through which the substrate may be exposed. The second contact hole may be filled with a conductive material. The conductive material may be electrically connected to the substrate.

BRIEF DESCRIPTION OF THE DRAWINGS

Example, non-limiting embodiments of the present invention will be described with reference to the accompanying drawings.

DESCRIPTION OF EXAMPLE, NON-LIMITING EMBODIMENTS

Figure 1:
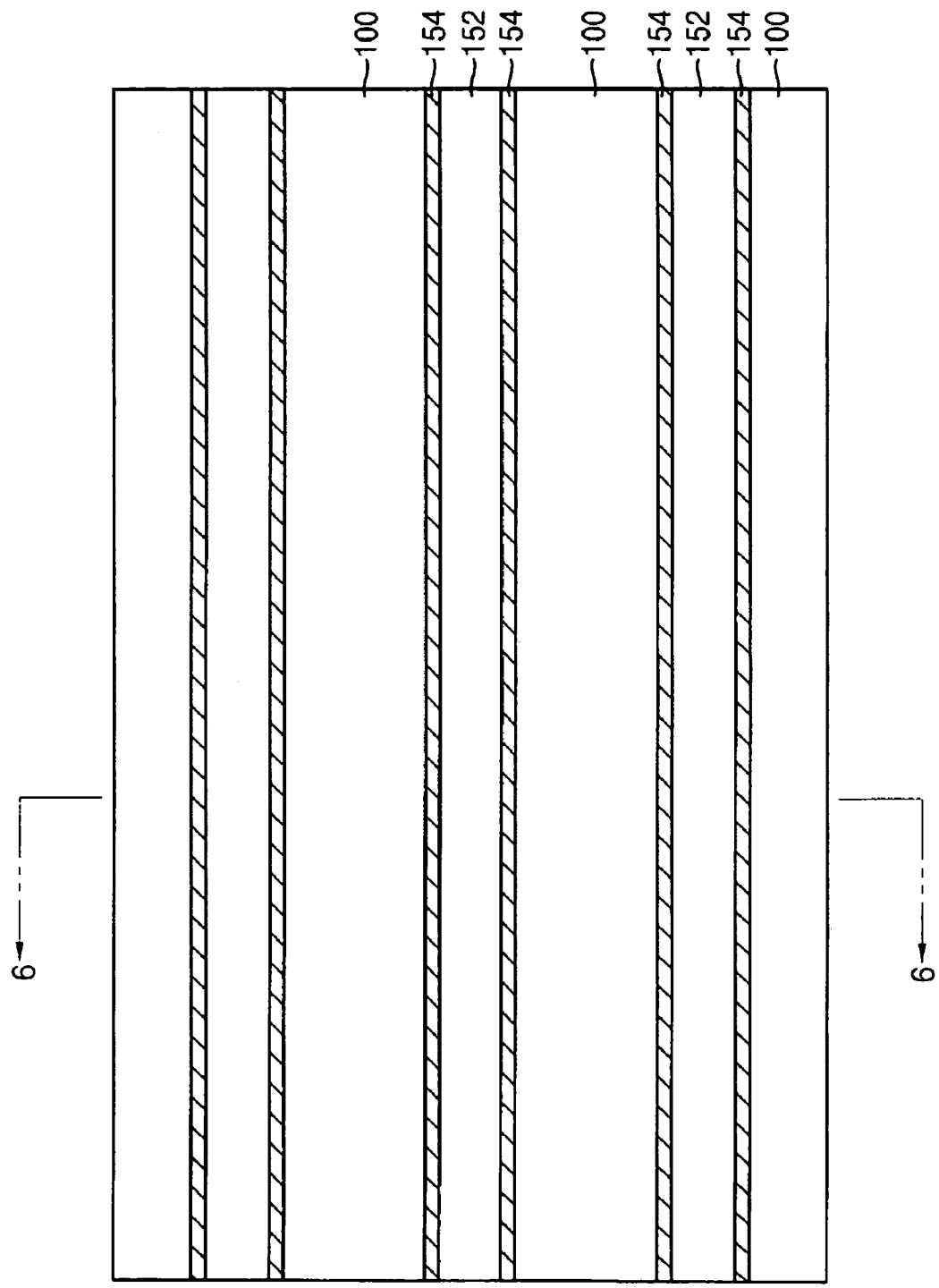
FIGS. 1 to 5 are plan views of a method that may be implemented to manufacture a semiconductor device in accordance with an example, non-limiting embodiment of the present invention.

Example, non-limiting embodiments of the invention are described with reference to the accompanying drawings. The invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the sizes and relative sizes of layers and regions may be exaggerated for clarity. The drawings are not to scale. Like reference numerals refer to like elements throughout.

It will be understood that when an element or layer is referred to as being "on", "connected to" and/or "coupled to" another element or layer, it can be directly on, connected and/or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" includes any and all combinations of one or more of the associated listed items.

Although the terms first, second, third etc. may be used to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like, may be used to describe one element and/or feature's relationship to another element(s) and/or feature(s), for example, as illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing example embodiments only and is not intended to be limiting of the invention. As used herein, the singular terms "a," "an" and "the" are intended to include the plural forms as well, unless the context clearly indicates otherwise. It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description refers to cross-section illustrations, which may be schematic illustrations of example embodiments (and intermediate structures). As such, variations from the shapes of the illustrations as a result, for example, of manufacturing techniques and/or tolerances, may be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded and/or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and their shapes are not intended to illustrate the actual shape of a region of a device and are not intended to limit the scope of the invention.

Unless otherwise defined, all terms (including technical and scientific terms) used herein may have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

FIGS. 1 to 5 are plan views of a method that may be implemented to manufacture a semiconductor device in accordance with an example, non-limiting embodiment of the present invention. FIGS. 6 to 10 are cross-sectional views illustrating the semiconductor device corresponding to each of FIGS. 1 to 5, respectively.

Figure 6:
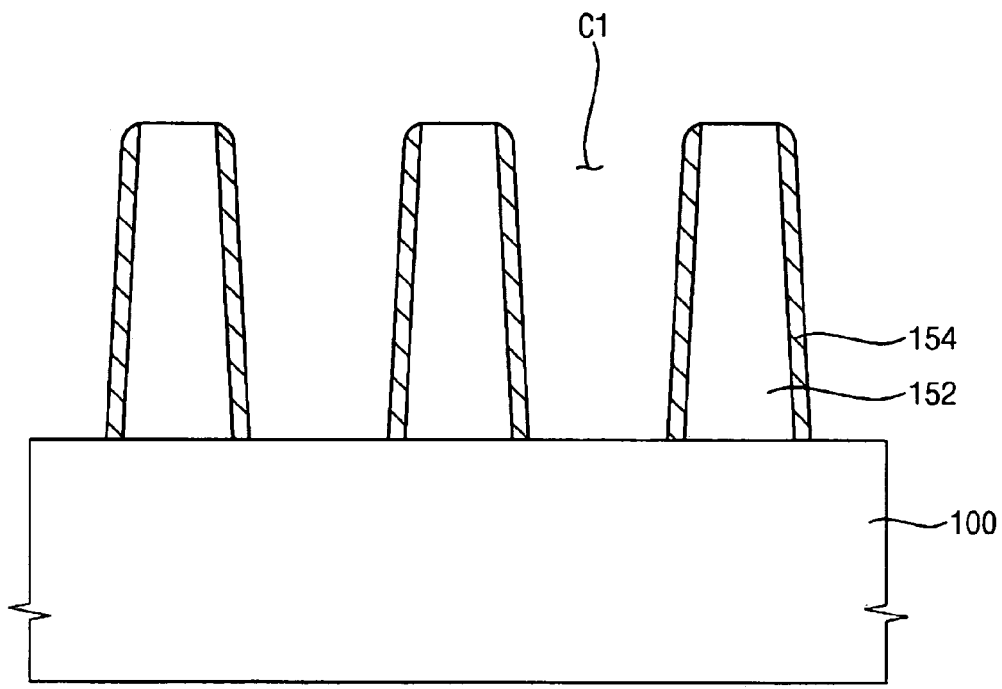
FIGS. 6 to 10 are cross-sectional views of the semiconductor device corresponding to FIGS. 1 to 5, respectively.

FIG. 6 is a cross-sectional view taken along the line 6-6 in FIG. 1. FIGS. 1 and 6 illustrate a method that may be implemented to form a first insulation layer pattern and a spacer of the semiconductor device.

Referring to FIGS. 1 and 6, a first insulation layer pattern 152 and a spacer 154 may be provided on a substrate 100.

For example, a first insulation layer (not shown) may be provided on the substrate 100. By way of example only, the first insulation layer may be fabricated from an oxide such as borophosphosilicate glass (BPSG), phosphosilicate glass (PSG), undoped silicate glass (USG), spin-on glass (SOG), flowable oxide (FOx), plasma-enhanced tetraethylorthosilicate (PE-TEOS), high-density plasma chemical vapor deposition (HDP-CVD) oxide, etc. The substrate 100 may include a conductive layer pattern (not shown). The first insulation layer may be provided by a chemical vapor deposition (CVD) process, a plasma-enhanced chemical vapor deposition (PECVD) process, an atomic layer deposition (ALD) process, and a high-density plasma chemical vapor deposition (HDP-CVD) process, for example. The first insulation layer may be etched using a photoresist pattern as an etching mask to form the first insulation layer pattern 152 and a first contact hole C1. The first contact hole C1 may define a region in which a conductive layer pattern may be provided. The first insulation layer pattern 152 and a first contact hole C1 may be provided by an anisotropic etching process (for example) using a photoresist pattern as an etching mask. The first insulation layer pattern 152 may be etched at a first etching rate in an etching process for providing a second contact hole, as will be described with reference to FIG. 9.

By way of example only, the first insulation layer pattern 152 may have a trapezoidal shape. The first insulation layer pattern 152 may have a shape that tapers away from the substrate 100. In an example embodiment of the present invention, a lower portion of the first insulation layer pattern 152 may have a width substantially wider than that of an upper portion thereof. Thus, the first contact hole C1 may have a shape that tapers toward the substrate 100. The photoresist pattern may be removed by an ashing process and/or a stripping process, for example.

An insulation layer (not shown) for forming a spacer 154 may be provided on the substrate 100. The insulation layer may be provided on the substrate 100 and a top surface and a sidewall of the first insulation layer pattern 152. The insulation layer (for providing the spacer 154) may be fabricated from a material having a second etching rate lower than the first etching rate of the first insulation layer pattern 152 in an etching process for providing a second contact hole, as will be described with reference to FIG. 9. By way of example only, if the first insulation layer pattern 152 is fabricated from an oxide, then the insulation layer may be fabricated from a nitride such as silicon nitride and/or silicon oxynitride, for example.

The insulation layer may be patterned by an anisotropic etching process to provide the spacer 154 on a sidewall of the first insulation layer pattern 152. The spacer 154 may have an upper portion having an arcuate profile. The spacer 154 on the first insulation layer pattern 152 may have a shape that tapers away from the substrate 100. The spacer 154 may have a second etching rate that may be less than the first etching rate of the first insulation layer pattern 152 so that the spacer 154 may have an etching selectivity relative to the first insulation layer pattern 152. For example, the first etching rate of the first insulation layer pattern 152 may be about 3 times to about 6 times greater than the second etching rate of the spacer 154. The first etching rate of the first insulation layer pattern 152 may be about 3 times to about 5 times greater than the second etching rate of the spacer 154. As will be described in more detail with reference to FIG. 9, the spacer 154 may serve as a self-aligning mask when the first insulation layer pattern is etched to form a second contact hole.

Figure 2:
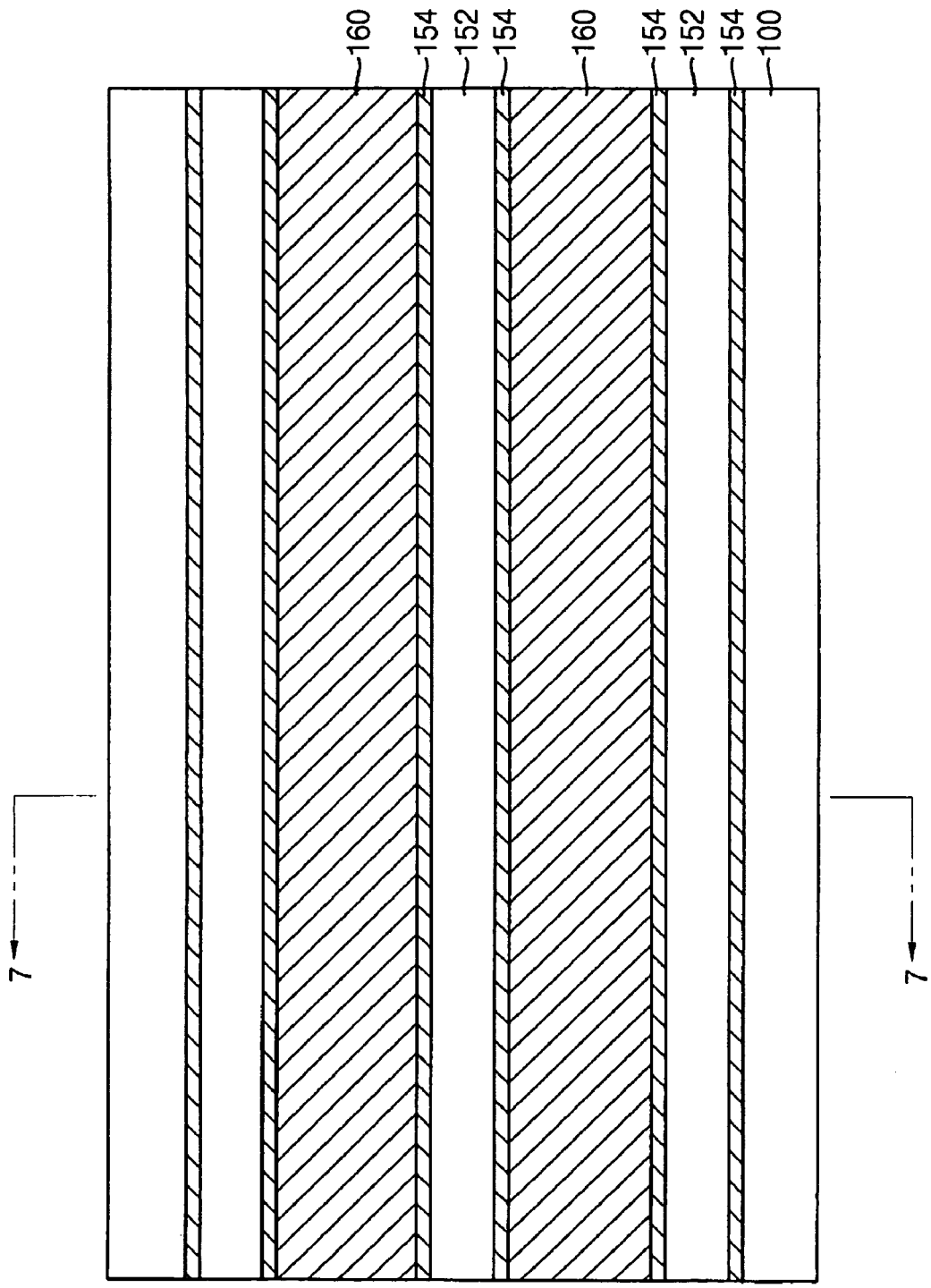
Figure 7:
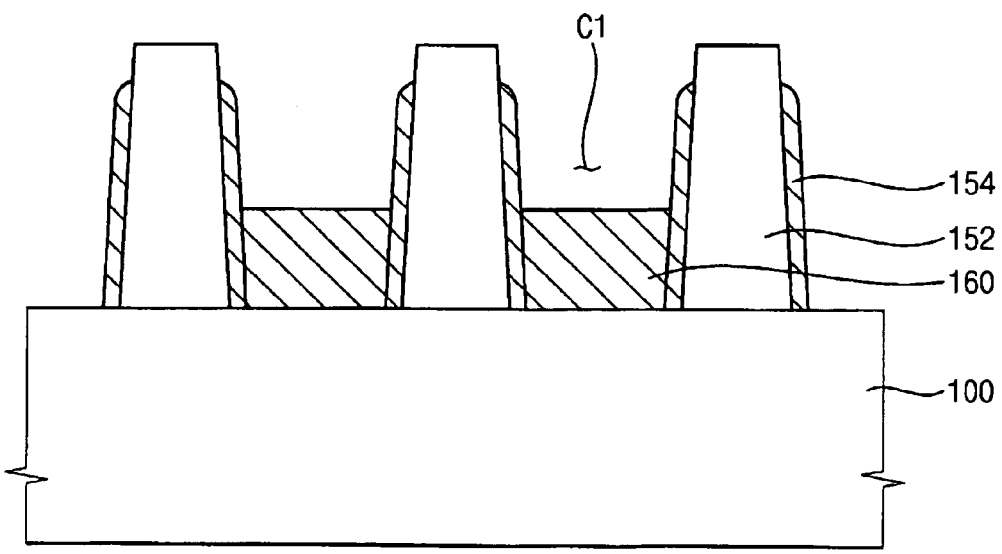

FIG. 7 is a cross-sectional view taken along a line 7-7 in FIG. 2. FIGS. 2 and 7 illustrate a method that may be implemented to form a bit line and/or a word line (for example) of the semiconductor device.

Referring to FIGS. 2 and 7, a conductive layer pattern 160, such as a bit line or a word line (for example), may be provided on the substrate 100. The conductive layer pattern 160 may at least partially fill the contact hole C1.

For example, a conductive layer (not shown) may be provided on the substrate 100 to fill up the first contact hole C1 defined by the first insulation layer pattern 152 and the spacer 154.

By way of example only, the conductive layer may be fabricated from a polysilicon doped with impurities, a metal nitride such as titanium nitride, and/or a metal such as tungsten, aluminum, copper, etc. In an example embodiment, the conductive layer may be fabricated from tungsten. The conductive layer including tungsten may be provided by a chemical vapor deposition (CVD) process and/or a sputtering process, for example.

The conductive layer may be etched to provide the conductive layer pattern 160 in a lower portion of the first contact hole C1. A top surface of the conductive layer pattern 160 may be lower than that of the first insulation layer pattern 152. The conductive layer pattern 160 may be provided by an anisotropic etching process. for example. Alternatively, the conductive layer pattern 160 may be provided by sequentially performing a chemical mechanical polishing (CMP) process and a dry etching (and/or anisotropic etching) process, for example. In alternative embodiments, the conductive layer pattern 160 may not be provided in the first contact hole C1 at this time.

When the conductive layer pattern 160 is provided by an anisotropic etching process, the first insulation layer pattern 152 and the spacer 154 may be partially removed from the substrate 100. As a result, the first insulation layer pattern 152 and the spacer 154 may have decreased heights. For example, a top surface of the spacer 154 may be lower than that of the first insulation layer pattern 152. The first insulation layer pattern and the spacer in FIG. 7 are designated with the same reference numerals as shown in FIGS. 2 and 6, despite some removal from the substrate 100 due to the etching process for providing the conductive layer pattern 160.

Figure 3:
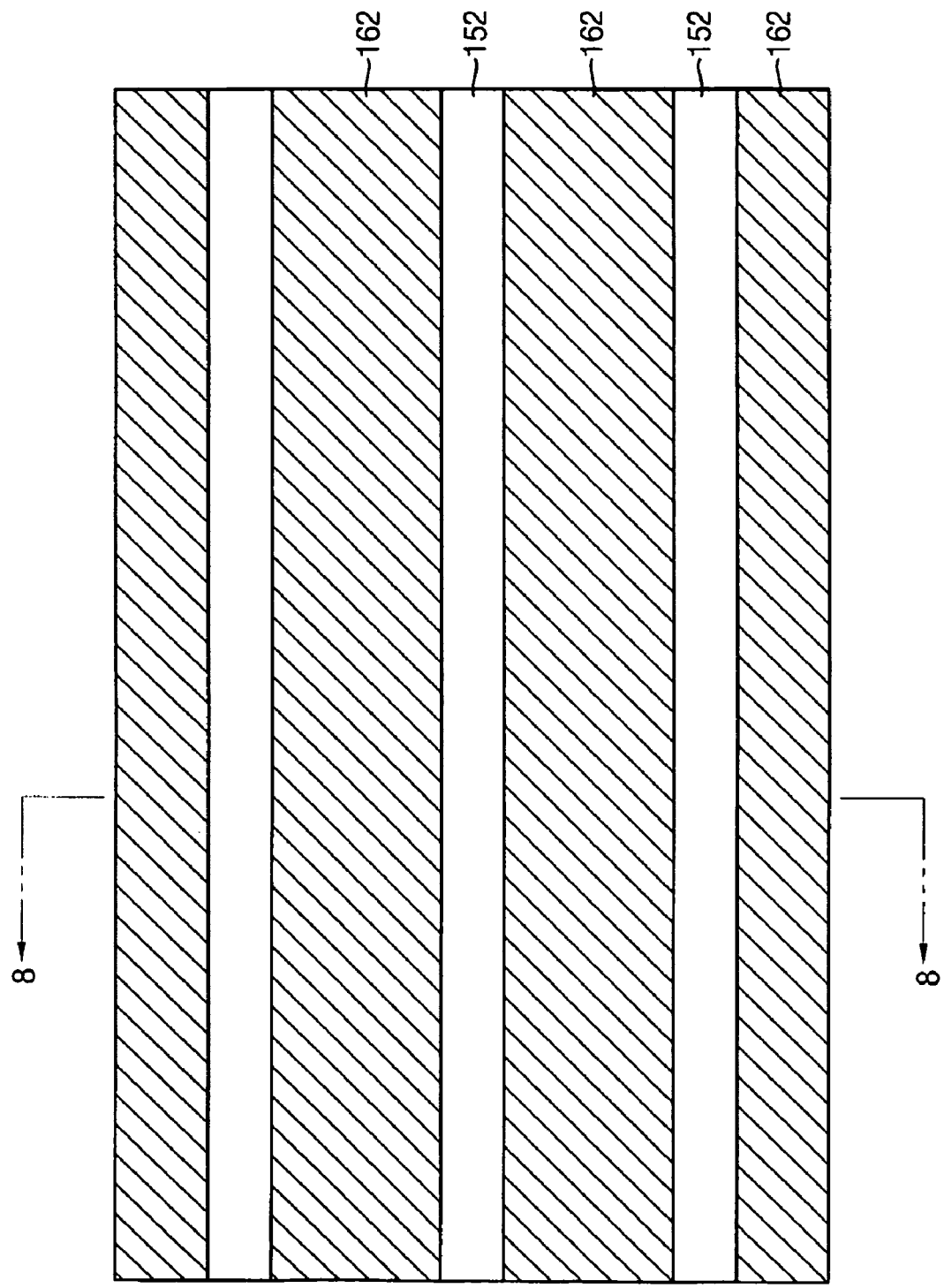
Figure 8:
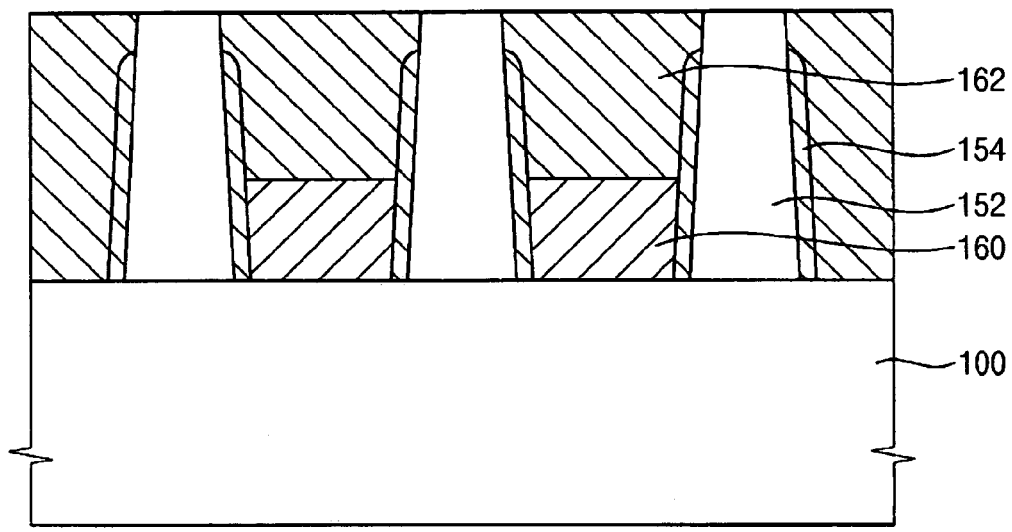

FIG. 8 is a cross-sectional view taken along a line 8-8 in FIG. 3. FIGS. 3 and 8 illustrate a method that may be implemented to form a second insulation layer pattern of a semiconductor device.

Referring to FIGS. 3 and 8, a second insulation layer pattern 162 may be provided on the conductive layer pattern 160 and a sidewall of the spacer 154. The second insulation layer pattern 162 may be fabricated from a material having a third etching rate lower than the first etching rate of the first insulation layer pattern 152 in an etching process for providing a second contact hole, as will be described with reference to FIG. 9.

For example, a second insulation layer (not shown) may be provided on the substrate 100 to fill up an upper portion of the first contact hole C1. The second insulation layer fabricated from a material having a third etching rate lower than the first etching rate of the first insulation layer 152 in an etching process for providing a second contact hole, as will be described with reference to FIG. 9. By way of example only, the third etching rate may be substantially identical to the second etching rate of the spacer 154 in an etching process for providing a second contact hole, as will be described with reference to FIG. 9.

For example, when the first insulation layer pattern 152 is fabricated from oxide, the second insulation layer (for providing the second insulation layer pattern 162) may be fabricated from a nitride such as silicon nitride, silicon oxynitride, etc. When the second insulation layer is fabricated from silicon nitride (for example), the second insulation layer may be provided by a low-pressure chemical vapor deposition (LPCVD) process and/or a PECVD process using a source gas that may include silane ($SiH_4$) gas, dichlorosilane ($SiH_2Cl_2$) gas and ammonia ($NH_3$) gas, for example.

The second insulation layer may be planarized until a top surface of the first insulation layer pattern 152 is exposed through a CMP process, an etch-back process and/or a combination process of the CMP and etch-back processes (for example), so that the second insulation layer may remain on the conductive layer pattern 160 to form the second insulation layer pattern 162 in the first contact hole C1. By way of example only, the second insulation layer pattern 162 may have a trapezoidal shape that tapers away from the substrate 100. Here, an upper portion of the second insulation layer pattern 162 may have a width wider than a lower portion thereof.

The second insulation layer pattern 162 and the spacer 154 may serve as a self-aligning mask when the first insulation layer pattern 152 is etched, thereby reducing a likelihood of damaging a portion of the spacer 154 that may be adjacent to a sidewall of the conductive layer pattern 160. The term "self-aligning mask" indicates that the mask is formed by structure (e.g., the second insulation layer pattern 162 and the spacer 154) that remains in a finished product. The self-alignment feature, which is well known in this art, may avoid misalignment concerns associated with photolithograph processes, for example. The second insulation layer pattern 162 and the spacer 154 may be fabricated from nitride (for example), and the second insulation layer pattern 162 may have the third etching rate substantially identical to the second etching rate of the spacer 154 in an etching process for providing a second contact hole, as will be described with reference to FIG. 9.

Figure 4:
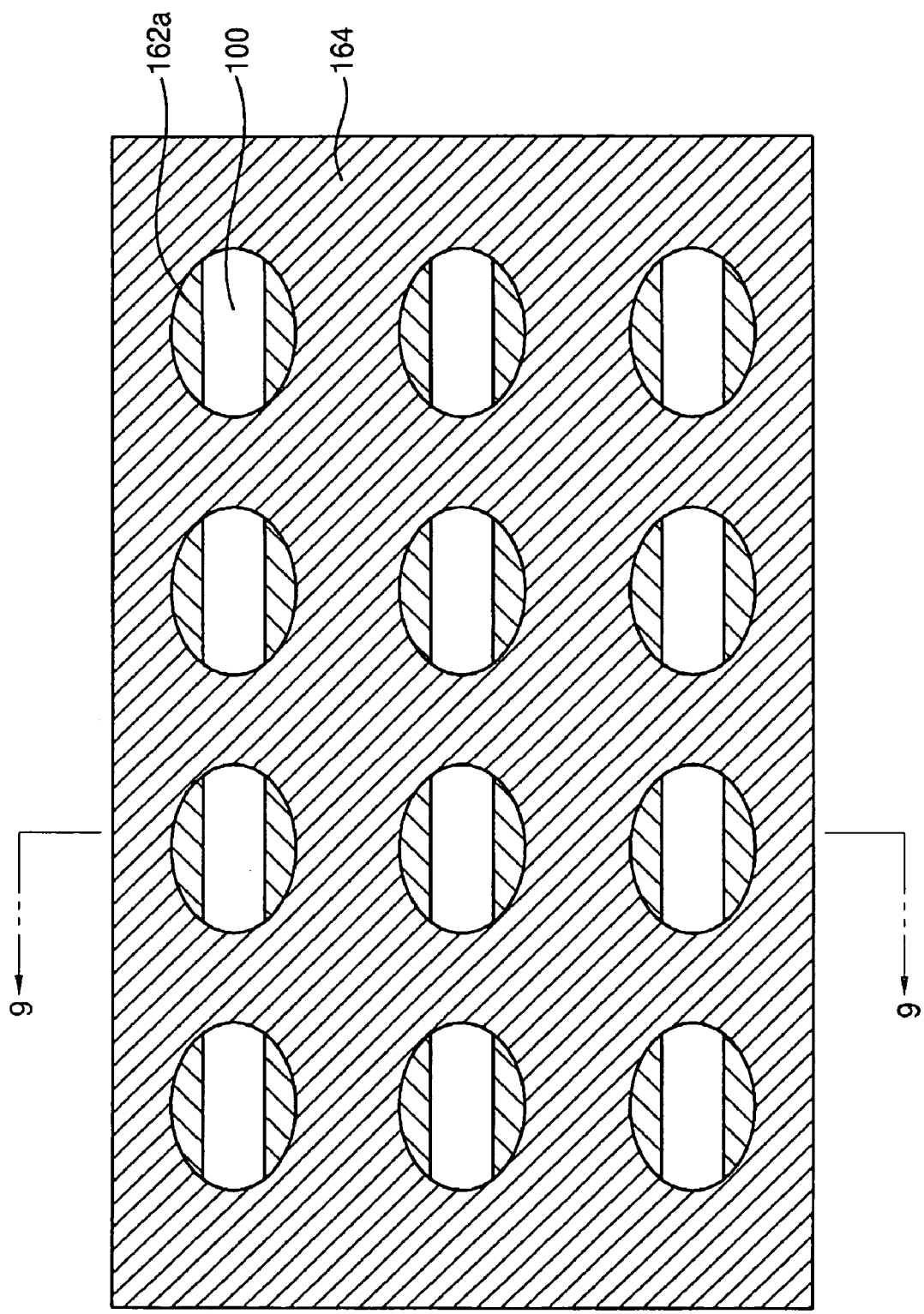
Figure 9:
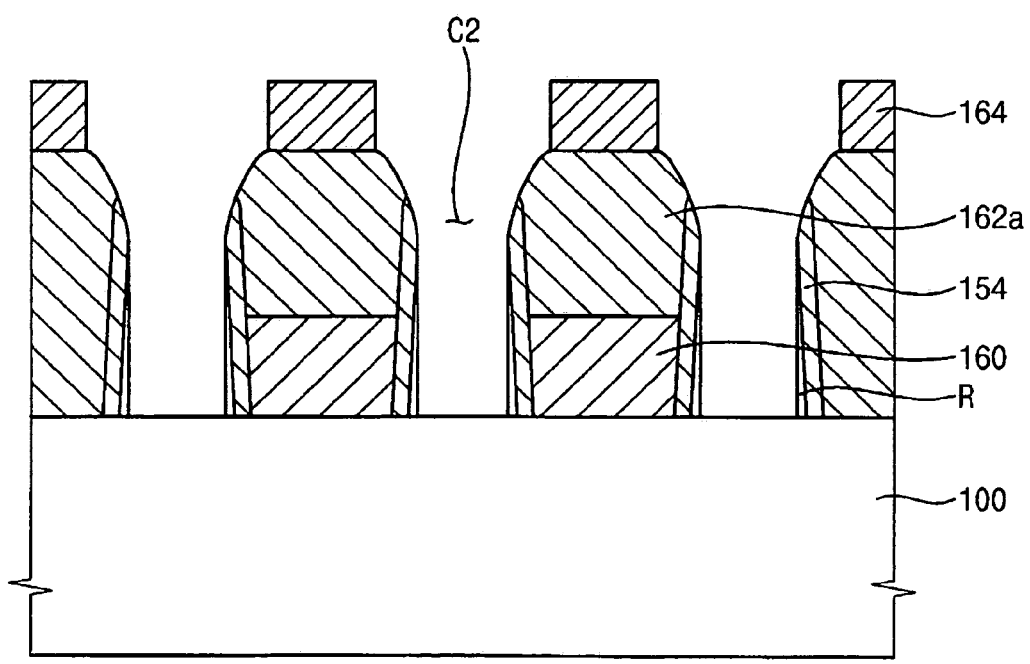

FIG. 9 is a cross-sectional view taken along a line 9-9 in FIG. 4. FIGS. 4 and 9 illustrate a method that may be implemented to form a second contact hole C2 of a semiconductor device.

Referring to FIGS. 4 and 9, the first insulation layer pattern 152 may be anisotropically etched using the second insulation layer pattern 162 and the spacer 154 as a self-aligning mask to form the second contact hole C2. The substrate 100 may be exposed through the second contact hole C2.

For example, an etching mask pattern 164 may be provided on the second insulation layer pattern 162. The etching mask pattern 164 may define a region in which the second contact hole C2 is to be provided. The first insulation layer pattern 152 and a peripheral portion of the second insulation layer pattern 162 may be exposed through the etching mask pattern 164. The etching mask pattern 164 may be a photoresist pattern, for example.

The first insulation layer pattern 152 and the exposed peripheral portion of the second insulation layer pattern 162 may be anisotropically etched to provide the second contact hole C2. When the first insulation layer pattern 152 is etched to expose the substrate 100, the potential for damaging the spacer 154 adjacent to the conductive layer pattern 160 may be reduced and/or altogether avoided.

The second insulation layer pattern 162 may have the third etching rate lower than the first etching rate of the first insulation layer pattern 152. Thus, as the first insulation layer pattern 152 is etched, the second insulation layer pattern 162 (which may have a peripheral portion exposed through the etching mask pattern 164) may be etched so that a top surface of the spacer 154 may be exposed.

The second contact hole C2, which may be provided using the spacer 154 and the second insulation layer pattern 162 as the self-aligned mask, may have a bottom width smaller than a width of a lower portion of the first insulation layer pattern 152 because a distance between upper portions of spacers adjacent to each other may be smaller than a width of a lower portion of the first insulation layer pattern 152. Thus, a residual portion R of the first insulation layer pattern 152 may remain on a sidewall of the spacer 154. The residual portion R of the first insulation layer pattern 152 may reduce the chances of (and quite possibly altogether prevent) a reduction in breakdown voltage between a wire and a conductive layer pattern that may be provided in a subsequent process. In this way, the residual portion R of the first insulation layer pattern 152 may improve (for example) electrical characteristics of the semiconductor device.

Figure 5:
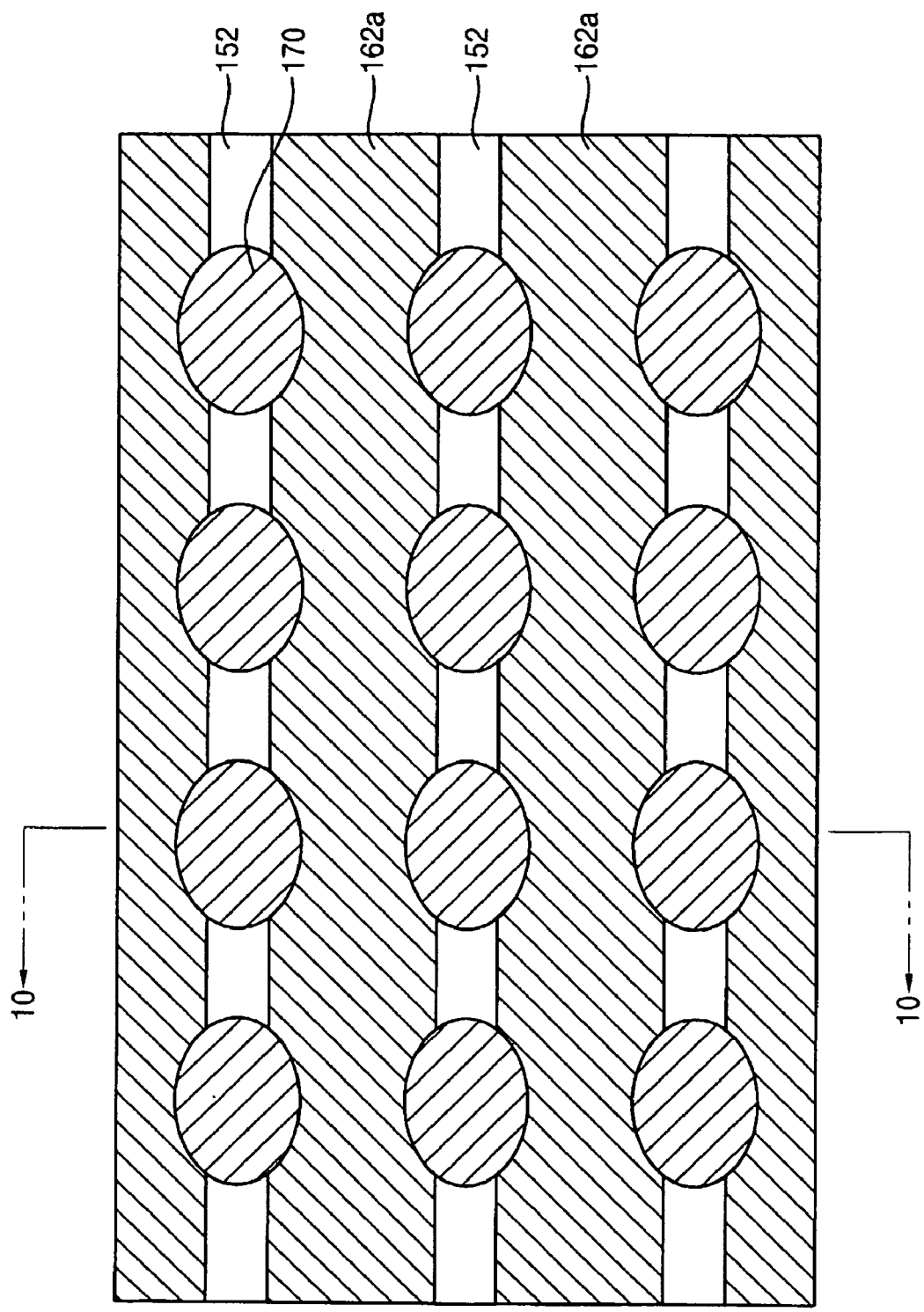
Figure 10:
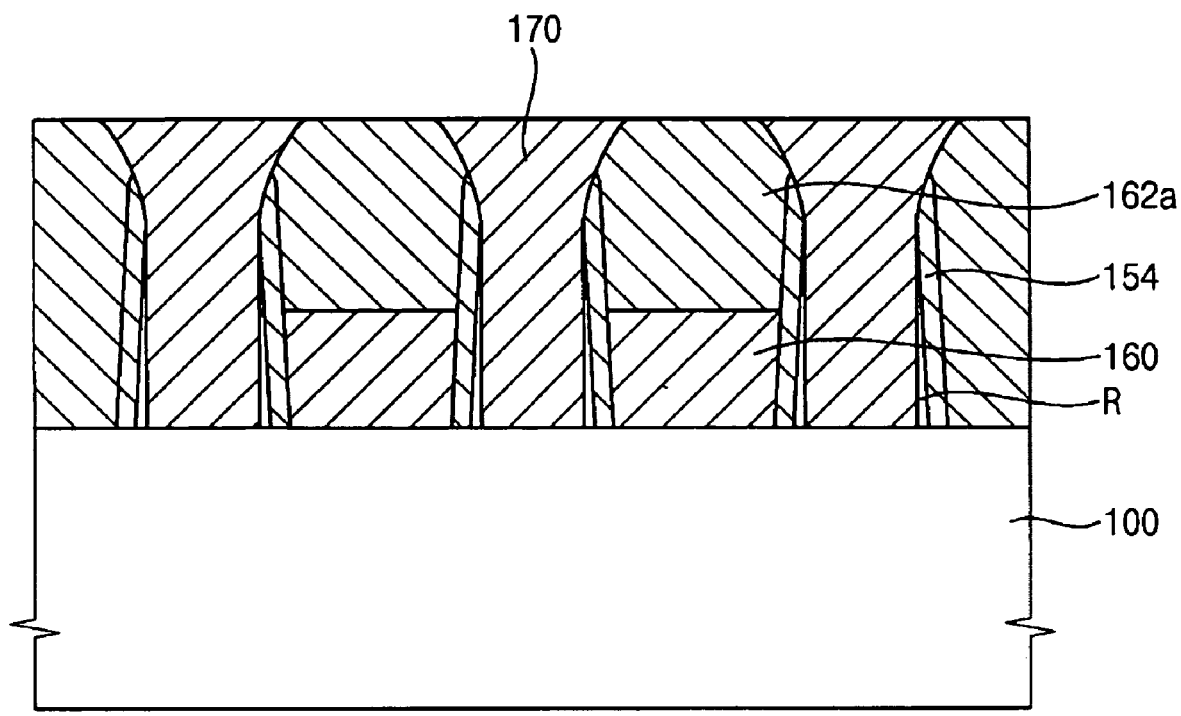

FIG. 10 is a cross-sectional view taken along a line 10-10 in FIG. 5. FIGS. 5 and 10 illustrate a method that may be implemented to form a contact pad of a semiconductor device.

Referring to FIGS. 5 and 10, a contact pad 170, which may be electrically connected to the substrate 100, may be provided in the second contact hole C2.

For example, the etching mask pattern 164 may be removed from the second insulation pattern 162a. A conductive layer (not shown) may be provided on the substrate 100 to fill up the second contact hole C2. By way of example only, the conductive layer may be fabricated from a polysilicon doped with impurities, a metal nitride such as titanium nitride, and/or a metal such as tungsten, aluminum, copper, etc.

In an example embodiment, the conductive layer may be fabricated from a metal such as tungsten, aluminum, copper, etc. The conductive layer including tungsten, for example, may be fabricated by a CVD process and/or a sputtering process, for example. The conductive layer may be planarized until a top surface of the second insulation layer pattern 162a may be exposed to form the contact pad 170. The conductive layer may be planarized by an etch-back process, a chemical mechanical polishing (CMP) process, or a combination process of etch-back and CMP, for example.

According to the above-described method, the spacer 154, which may have an improved shoulder margin, the residual portion R of the first insulation layer pattern 152 and the second insulation layer pattern 162a may electrically insulate the contact pad 170 from the conductive layer pattern 160. In this way, a breakdown voltage may not be reduced between the contact pad 170 and the conductive layer pattern 160.

FIGS. 11 to 20 are cross-sectional views illustrating a method that may be implemented to form a semiconductor device in accordance with an example, non-limiting embodiment of the present invention.

Figure 11:
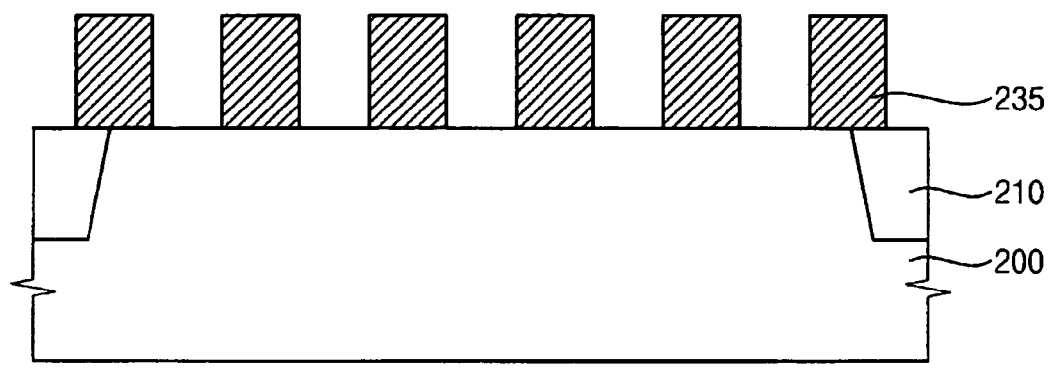
FIGS. 11 to 20 are cross-sectional views of a method that may be implemented to form a semiconductor device in accordance with another example, non-limiting embodiment of the present invention.

Referring to FIG. 11, a gate structure 235 may be provided on a silicon substrate 200 that may include an isolation layer 210.

For example, a pad oxide layer (not shown) may be provided on the silicon substrate 200. S nitride layer may be provided on the pad oxide layer by a thermal oxidation process and/or a CVD process, for example.

A photoresist pattern (not shown) may be provided on the nitride layer. The nitride layer may be etched using the photoresist pattern as an etching mask to form a nitride layer pattern (not shown) on the pad oxide layer. The photoresist pattern may be removed from the nitride layer pattern by an ashing process and a cleaning process, for example.

The pad oxide layer and the silicon substrate may be etched using the nitride layer pattern as an etching mask to form a trench (not shown) on a surface of the silicon substrate 200. The nitride layer pattern may be removed from the substrate 200. The trench may have a depth of about 1,000 to about 5,000 Å (for example), and in particular, the trench may have a depth of about 2,300 Å.

A liner may be provided on an inner surface of the trench. The liner may cure damage to the silicon substrate that may be caused by an etching process for forming the trench, and may prevent current leakage from the inner surface of the trench.

Referring now to FIG. 11, an insulation layer (not shown) (which may isolate devices on the substrate from each other) may be provided on the substrate 200 to fill up the trench. The insulation layer may be planarized until a top surface of the silicon substrate 200 may be exposed, so that the insulation layer may remain in the trench of the substrate 200. In the present embodiment, the insulation layer may be planarized by a CMP process, an etch-back process, or a combination process of CMP and etch-back, for example. The remaining insulation layer in the trench may electrically isolate (and separate) an active region from a field region on the substrate 200. The insulation layer in the trench may be referred to as an isolation layer 210.

A gate oxide layer (not shown) may be provided on the silicon substrate 200. The gate oxide layer may include a silicon oxide layer, for example. The silicon oxide layer may be fabricated by an LPCVD process, for example. Alternatively, the silicon oxide layer may be fabricated by wet-oxidizing a surface of the silicon substrate, for example. Alternatively, the silicon oxide layer may be fabricated by thermally oxidizing a surface of the silicon substrate 200 under an oxygen atmosphere with an oxidant gas including oxygen, for example.

In an example embodiment, the gate oxide layer may be provided by thermally oxidizing a surface of the silicon substrate 200 under an oxygen atmosphere with an oxidant gas including oxygen.

A conductive layer (not shown) may be provided on the silicon substrate 200. The conductive layer may be fabricated from a polysilicon doped with impurities and/or a metal, for example. The conductive layer may include a polysilicon layer doped with n-type impurities, a polysilicon layer, a metal layer or a dual layer having a polysilicon layer and a metal silicide layer, for example.

The metal silicide layer may be fabricated from a metal silicide such as tungsten silicide ($WSi_x$), titanium silicide ($TiSi_x$), cobalt silicide ($CoSi_x$) and/or tantalum silicide ($TaSi_x$), for example. The metal layer may be fabricated from a metal such as tungsten and/or titanium, for example.

A mask layer pattern (not shown), which may defines a region in which a gate structure may be provided, may be provided on the conductive layer. The conductive layer and the gate oxide layer may be etched using the mask layer pattern as an etching mask to form a gate structure 235 on the silicon substrate 200. The gate structure 235 may include a gate oxide layer pattern, a conductive layer pattern and the mask layer pattern.

Figure 12:
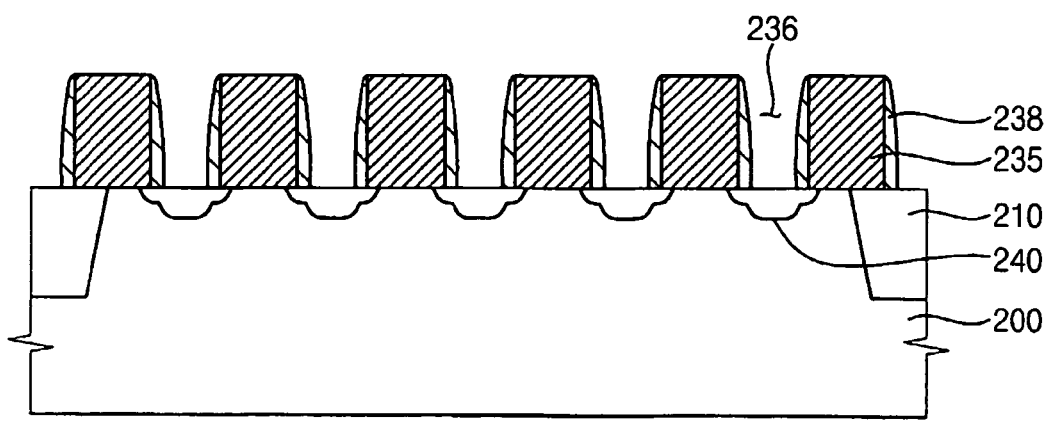

Referring to FIG. 12, first impurities may be implanted onto the surface of the silicon substrate 200 using the gate structure 235 as an ion-implanting mask to form first preliminary source/drain regions at surface portions of the substrate 200. For example, N+ impurities may be implanted when a P-type well is provided on the silicon substrate 200, whereas P+ impurities may be implanted when an N-type well is provided on the silicon substrate 200. The first impurities in the first preliminary source/drain regions may not be active.

An insulation layer (not shown) for providing a gate spacer may be provided on the silicon substrate 200 to cover the gate structure 235. The insulation layer for providing the gate spacer may be fabricated from oxide and/or nitride, for example. The insulation layer for providing the gate spacer may be anisotropically etched until the surface of the silicon substrate 200 may be exposed, so that the insulation layer may remain on a sidewall of the gate structure 235 to form a gate spacer 238 on the sidewall of the gate structure 235 and an opening 236 through which the surface of the silicon substrate 200 may be exposed. In this way, a plurality of word lines may be provided on the silicon substrate 200. Here, the word lines may be provided in the active regions of the silicon substrate 200, and the gate spacer 238 and the mask layer pattern (not shown) may electrically insulate the word lines from each other.

Second impurities may be implanted onto the surface of the silicon substrate 200 having the first preliminary source/drain regions using the gate structure 235 (including the gate spacer 238) as an ion-implanting mask to form second preliminary source/drain regions at surface portions of the substrate 200. For example, the first preliminary source/drain regions may form lightly doped source/drain (LDD) structures. The second preliminary source/drain regions may be provided by additionally implanting the second impurities into the first preliminary source/drain regions by a concentration higher than that of the first impurities in the first preliminary source/drain regions. The second impurities in the second preliminary source/drain regions may not be active.

A heat treatment may be performed on the substrate 200 including the first and the second preliminary source/drain regions, so that the first and second impurities in the first and second preliminary source/drain regions may become active to form source/drain regions 240 at surface portions of the substrate 200. In the example embodiment, the heat treatment may include a rapid thermal annealing (RTA) process carried out at a temperature of about 900° C. to about 1,200° C., for example. A metal silicide layer may be provided in the source/drain regions 240 as an ohmic contact layer. As a result, a transistor, which may include the gate structure 235, the gate spacer 238 and the source/drain regions 240, may be provided on the silicon substrate 200.

Figure 13:
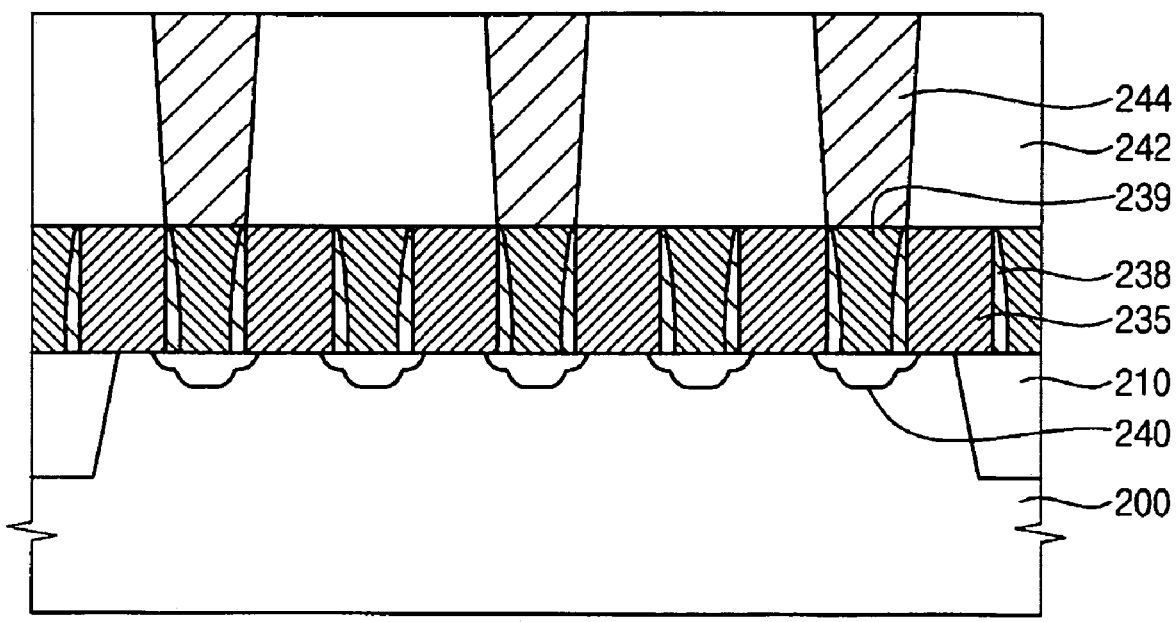

Referring to FIG. 13, a contact plug 239 may be provided in the opening 236 through which the silicon substrate 200 may be exposed. An insulation layer (not shown) may be provided on the silicon substrate 200. The insulation layer may be planarized and etched to form a first insulating interlayer 242 on the gate structures 235. A first contact pad 244 may extend through the first insulating interlayer 242 and may be electrically connected to the silicon substrate 200 (e.g., the source/drain regions 240).

For example, a photoresist pattern (not shown), which may define a region for providing a contact hole, may be provided on the insulation layer. The insulation layer may be anisotropically etched using the photoresist pattern as an etching mask to form the first insulating interlayer 242 having a contact hole through which the contact plug 239 may be exposed. The photoresist pattern may be removed from the first insulating interlayer 242 by an ashing process and/or a stripping process, for example. A conductive layer (not shown) may be provided on the first insulating interlayer to fill up the contact hole.

The conductive layer may be fabricated from a polysilicon doped with impurities, a metal nitride such as titanium nitride, and/or a metal such as tungsten, aluminum, copper, for example. In an example embodiment, the conductive layer may be fabricated from a metal such as tungsten, aluminum, and/or copper, for example. The conductive layer, which may include tungsten, may be planarized until a top surface of the first insulating interlayer 242 may be exposed, to thereby provide a first contact pad 244. The conductive layer may be planarized by an etch-back process, a CMP process or a combination process of etch-back and CMP, for example.

Figure 14:
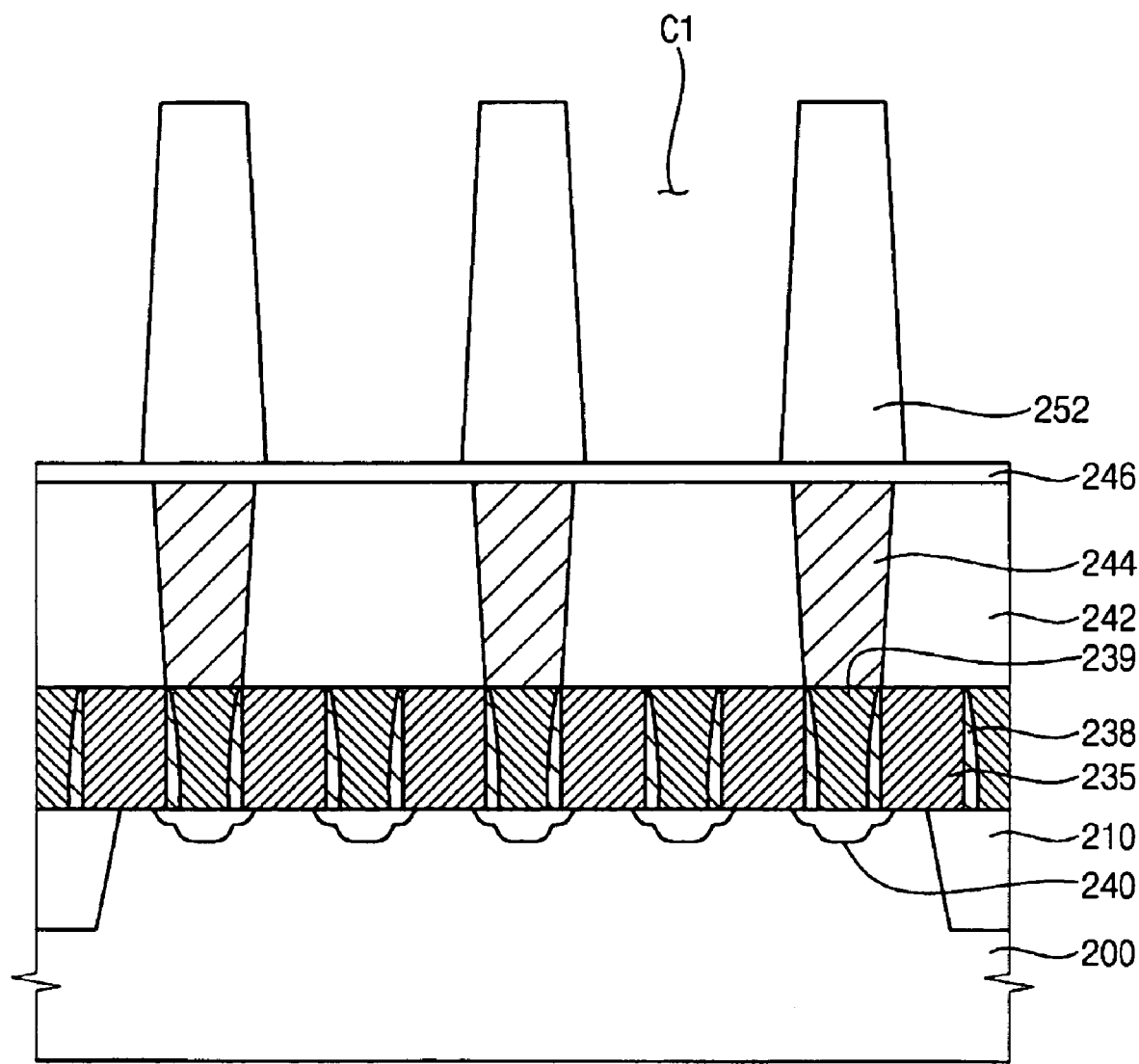

Referring to FIG. 14, a second insulating interlayer 246 and an oxide layer pattern 252 may be provided on the silicon substrate 200.

For example, the second insulating interlayer 246 may be provided on the silicon substrate 200, and a third insulating interlayer (not shown) may be provided on the second insulating interlayer 246. The second insulating interlayer 246 and the third insulating interlayer may be fabricated from an oxide such as borophosphosilicate glass (BPSG), phosphosilicate glass (PSG), undoped silicate glass (USG), spin-on glass (SOG), flowable oxide (FOx), plasma-enhanced tetraethylorthosilicate (PE-TEOS) and/or high-density plasma chemical vapor deposition (HDP-CVD) oxide, for example. By way of example only, the second insulating interlayer 246 may have an etching rate substantially identical to a first etching rate of the third insulating interlayer.

The third insulating interlayer may be anisotropically etched using a photoresist pattern (not shown) as an etching mask to form a plurality of oxide layer patterns 252. The third insulating interlayer may have the first etching rate in an etching solution that is capable of etching oxide. As a result, a first contact hole C1 may be provided between the oxide layer patterns 252. A bit line (not shown) may be provided in the first contact hole C1 in a subsequent process. The oxide layer patterns 252 may have a bar shape having sloped profiles. For example, the oxide layer patterns 252 may have a trapezoidal shape that tapers away from the silicon substrate 200, e.g., a lower portion of the oxide layer patterns 252 may have widths that may be wider than widths of an upper portion thereof. The photoresist pattern may be removed from the oxide layer patterns 252 by an ashing process and/or a stripping process, for example.

Figure 15:
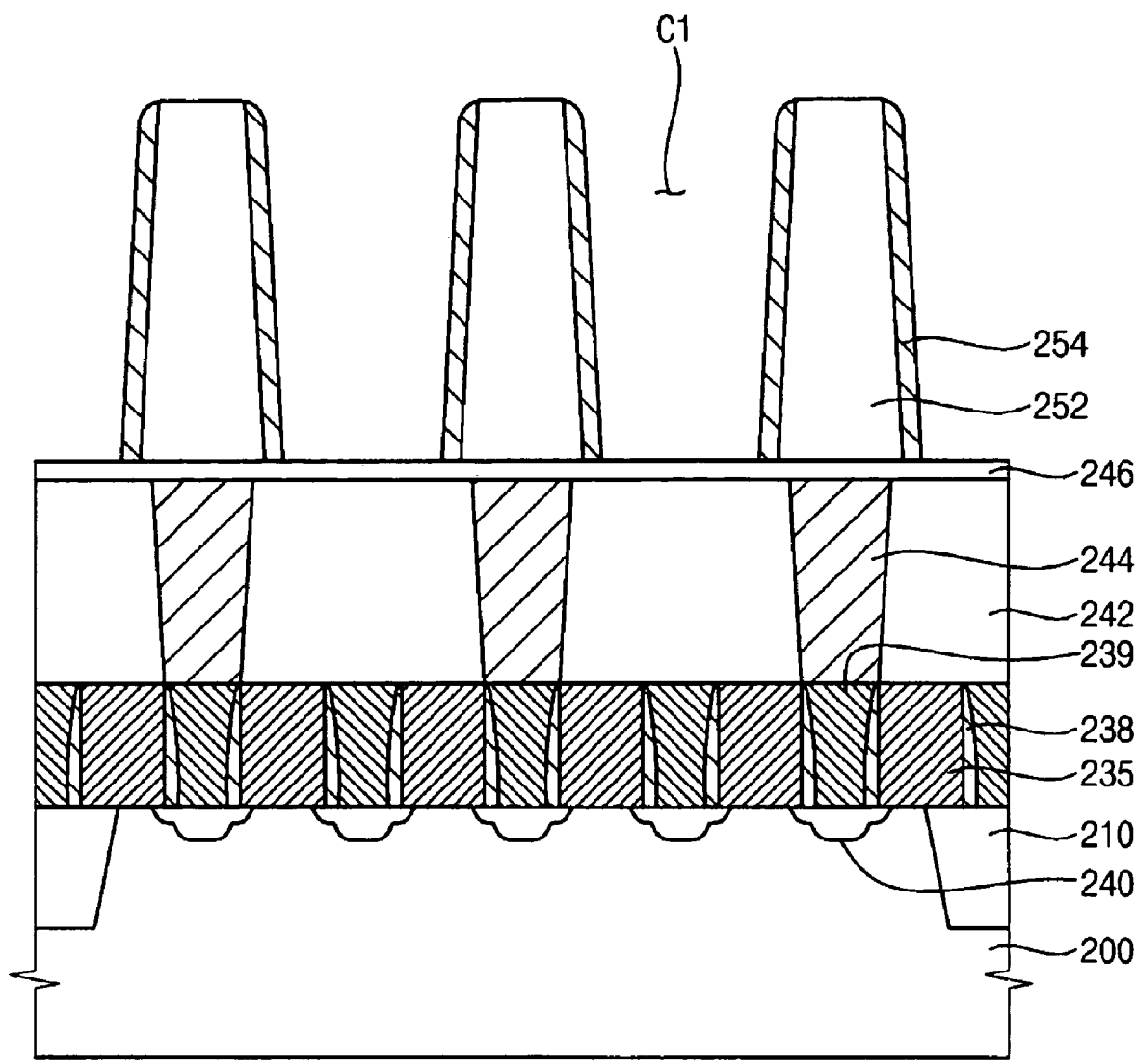

Referring to FIG. 15, an insulation layer (not shown) for providing a spacer 254 may be provided on the silicon substrate 200. The insulation layer for providing the spacer 254 may be provided on the second insulating interlayer 246 and a top surface and a sidewall of the oxide layer patterns 252. The insulation layer for providing the spacer 254 may be fabricated from a material having a second etching rate lower than the first etching rate of the oxide layer patterns 252. For example, the insulation layer may be fabricated from a nitride such as silicon nitride and/or silicon oxynitride, for example.

The insulation layer for providing the spacer 254 may be patterned by an anisotropic etching process to form the spacer 254 on the sidewall of the oxide layer patterns 252. The spacer 254 may have an upper portion having a round profile.

Figure 16:
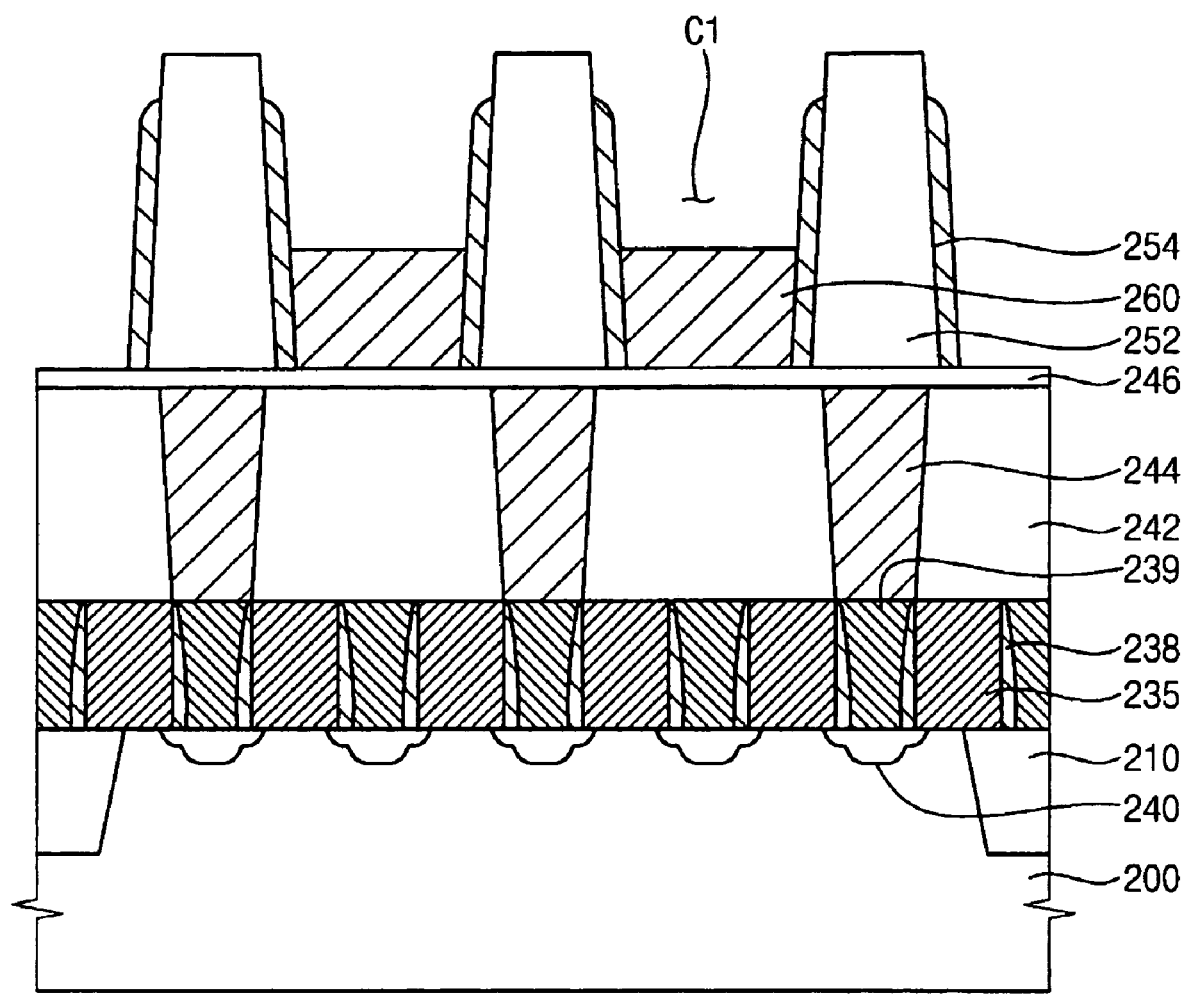

Referring to FIG. 16, a bit line 260 may be provided in the lower portion of first contact hole and on the second insulating interlayer 246.

For example, a conductive layer (not shown) may be provided on the oxide layer pattern 252 fill up the first contact hole C1 defined by the oxide layer pattern 252 including the spacer 254. In an example embodiment, the conductive layer may be fabricated from a metal such as tungsten, aluminum and/or copper, for example. The conductive layer, which may include tungsten, may be fabricated by a chemical vapor deposition (CVD) process and/or a sputtering process, for example.

The conductive layer may be etched so that a top surface of the conductive layer is lower than a top surface of the oxide layer pattern 252 to form a bit line 260 in the lower portion of first contact hole C1. The bit line 260 may be fabricated by an anisotropic etching process, for example. Alternatively, the bit line 260 may be fabricated by performing a chemical mechanical polishing (CMP) process and a dry etching (or an anisotropic etching) process, for example. As a modification of the present embodiment, the bit line 260 may not be provided in the first contact hole C1 that is overlapped with the second contact hole that may be provided in a subsequent process.

The oxide layer patterns 252 and the spacer 254 may be etched during the anisotropic etching process for providing the bit line 260, so that the oxide layer patterns 252 and the spacer 254 may have decreased heights. For example, a top surface of the spacer 254 may be lower than that of the oxide layer pattern 252. The oxide layer pattern and the spacer in FIG. 16 are designated with the same reference numerals shown in FIG. 15, despite that some material removal due to the above anisotropic etching process for providing the bit line 260.

Figure 17:
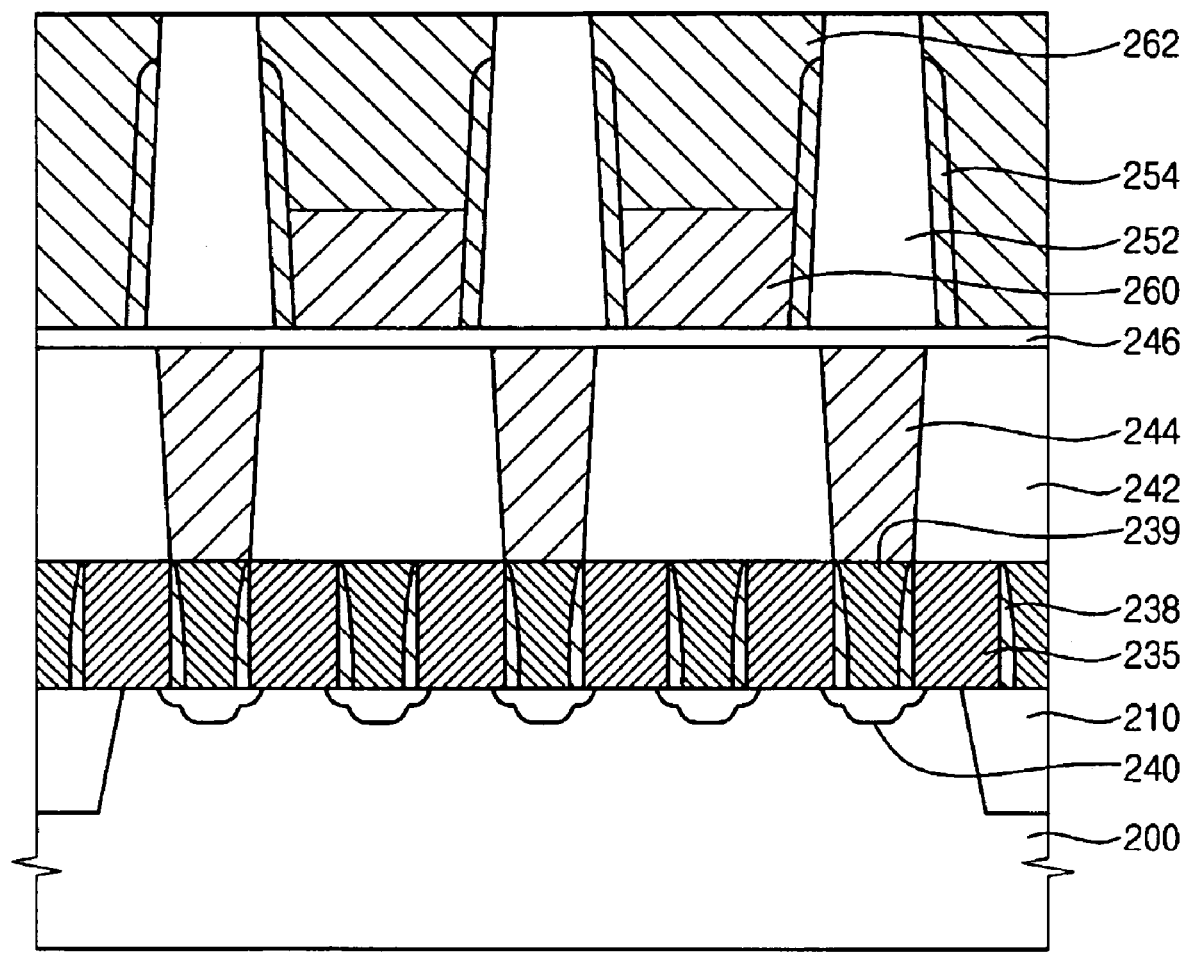

Referring to FIG. 17, a nitride layer pattern 262 (for example) may be provided in the contact hole C1 and on the bit line 260. The nitride layer pattern 262 may have a third etching rate lower than first etching rate of the oxide layer patterns 252. The nitride layer pattern 262 may serve as a mask pattern, and may be used as an etching mask for providing a second contact hole in a subsequent process.

For example, a nitride layer (not shown) may be provided on the bit line 260 and the oxide layer pattern 252 to fill up an upper portion of the first contact hole C1. The nitride layer may be fabricated from a material having a third etching rate lower than the first etching rate of the oxide layer patterns 252. Also, the third etching rate may be substantially identical to the second etching rate of the spacer 254.

For example, the third etching rate of the nitride layer may be about three to six times smaller than the first etching rate of the oxide layer patterns 252 in an etching solution for providing a second contact hole, which will be described with reference to FIG. 18. For example, the nitride layer may be fabricated from silicon nitride and/or silicon oxynitride.

The nitride layer may be planarized until a top surface of the oxide layer pattern 252 may be exposed to form the nitride layer pattern 262 on the bit line 260 and a sidewall of the spacer 254. The nitride layer may be planarized by an etch-back process, a CMP process or a combination process of etch-back and CMP, for example. The nitride layer pattern 262 may be used as an etching mask for providing a second contact hole, which will be described with reference to FIG. 18.

By way of example only, the nitride layer pattern 262 may have a trapezoidal shape that tapers toward the silicon substrate 200. A width of the nitride layer pattern 262 may be greater at an upper portion than at a lower portion thereof. The nitride layer pattern 262 may have a trapezoidal shape having a concaved sidewall.

The nitride layer pattern 262 and the spacer 254 may be used as a self-aligning mask in an etching process for providing the second contact hole, so that the spacer 254 on the sidewall of the bit line 260 may not be etched away from the second insulating interlayer 246.

Figure 18:
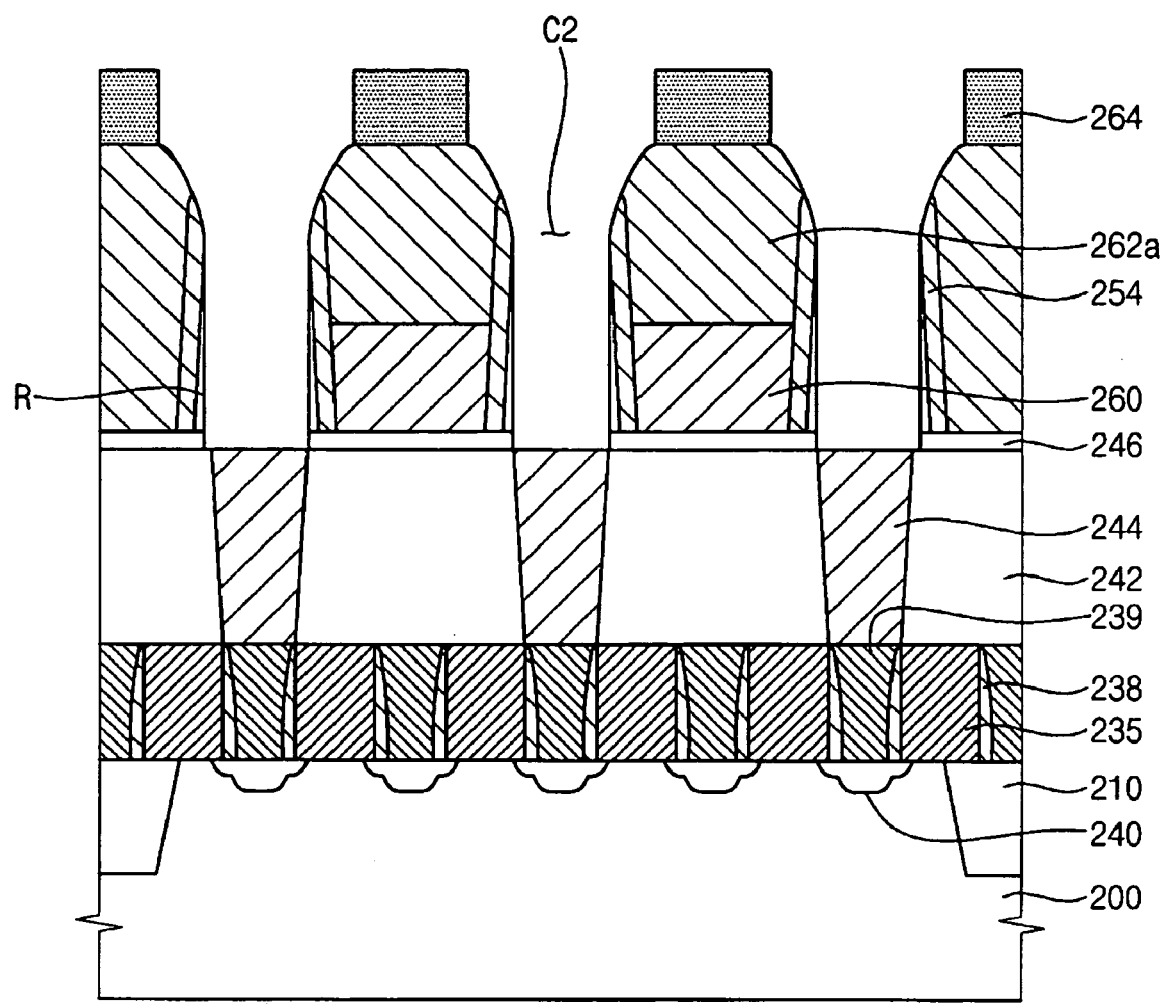

Referring to FIG. 18, a mask pattern 264, which may define a region corresponding to the second contact hole C2, may be provided on the oxide layer pattern 252, so that the oxide layer pattern 252 and a peripheral portion of the nitride layer pattern 262 may be exposed through the mask pattern 264. The mask pattern 264 may be a photoresist pattern, for example.

The oxide layer pattern 252, the peripheral portion of the nitride layer pattern 262 and the second insulating interlayer 246 may be anisotropically etched using the mask pattern 264 as an etching mask until a top surface of the first contact pad 244 may be exposed, thereby forming the second contact hole C2. The second contact hole C2 may expose the first contact pad 244. The third etching rate of the nitride layer pattern 262 and the second etching rate of the spacer 254 may be at least about four times smaller than the first etching rate of the oxide layer pattern 252 during the etching process for providing the second contact hole C2. In this way, the spacer 254 may not be etched from the sidewall of the bit line 260, even though the etching process for the second contact hole C2 may be continued until the first contact pad 244 may be exposed through the second contact hole C2. That is, the etching process may be continued until the second contact hole C2 may extend through the second insulating interlayer 246.

The nitride layer pattern 262 may be used as a self-aligning mask during the etching process for forming the second contact hole C2. Here, the nitride layer pattern 262 may be etched so that an upper portion of the spacer 254 may become exposed after a majority of the oxide layer pattern 252 may be etched away from the substrate 200. In FIG. 18, the nitride layer pattern (which may have an etched top portion) is designated as reference numeral 262a for differentiating from the initial nitride layer pattern 262. A distance between upper portions of adjacent spacers 254 may be smaller than a width of a lower portion of the oxide layer pattern 252.

As the etching process continues after the top portion of the spacer 254 may be exposed, the spacer 254 may function as a self-aligning mask. Here, a residual pattern R of the oxide layer pattern 252 may remain on the sidewall of the spacer 254 around the bit line 260. A width of the bottom of the second contact hole C2 may be smaller than a width of a lower portion of the oxide layer pattern 252.

The residual pattern R of the oxide layer pattern 252 may decrease the chances of a reduced breakdown voltage between the bit line 260 and a wiring, which may be provided in a subsequent process.

Figure 19:
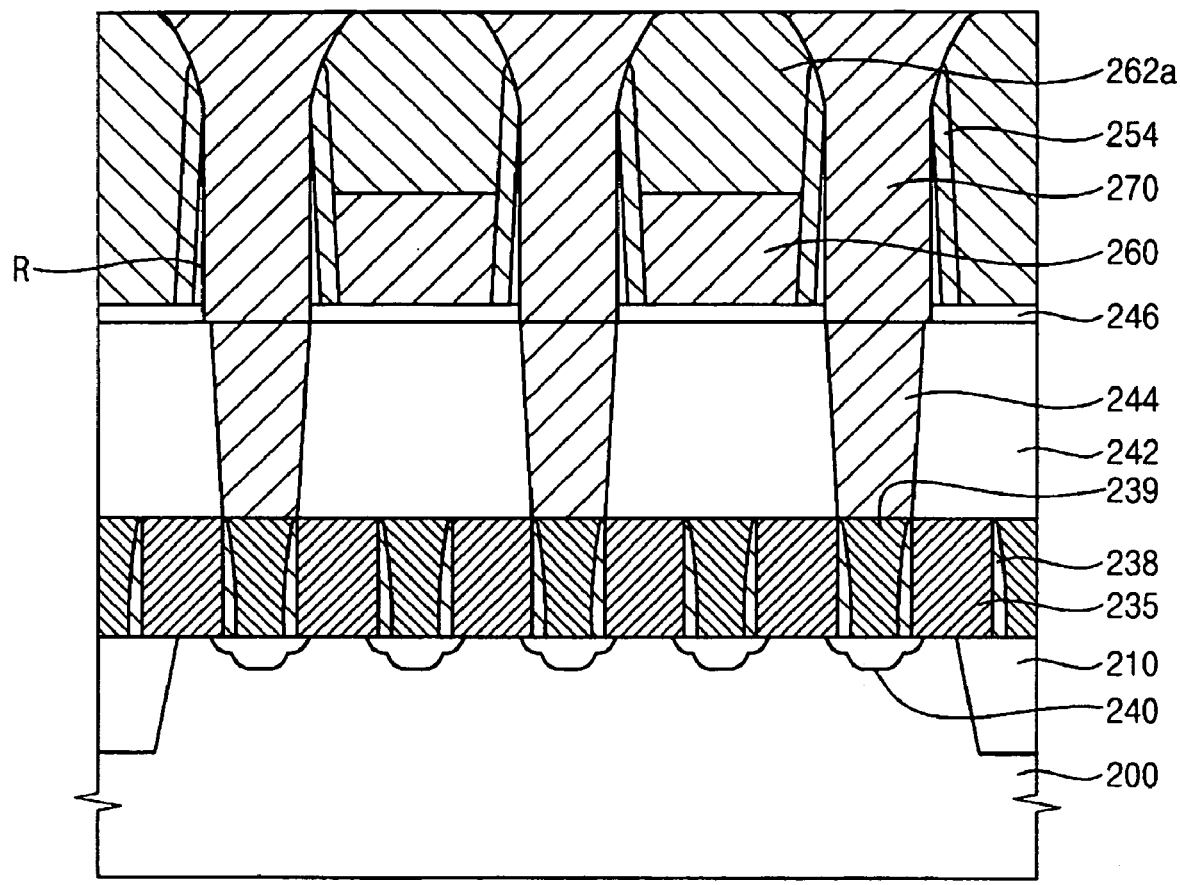

Referring to FIG. 19, a second contact pad 270, which may be a metal wiring for a capacitor (for example), may be provided in the second contact hole C2. The second contact pad 270 may be electrically connected to the first contact pad 244 penetrating through the first insulating interlayer 242.

For example, a conductive layer (not shown) may be provided on the substrate 200 to fill up the second contact hole C2 through which the top surface of the first contact pad 244 may be exposed. The conductive layer may be fabricated from a polysilicon doped with impurities, a metal nitride such as titanium nitride, and/or a metal such as tungsten, aluminum and/or copper, for example.

In an example embodiment, the conductive layer may be fabricated from a metal such as tungsten, aluminum and/or copper, for example. The conductive layer (which may include tungsten, for example) may be provided by a CVD process and/or a sputtering process, for example.

The conductive layer may be planarized until a top surface of the nitride layer pattern 262a may be exposed to form the second contact pad 270 in the second contact hole C2. The conductive layer may be planarized by an etch-back process, a CMP process, or a combination process of etch-back and CMP, for example.

The spacer 254, the residual pattern R of the oxide layer pattern 252 and the nitride layer pattern 262a may electrically insulate the second contact pad 270 from the bit line 260, so that a breakdown voltage between the second contact pad 270 and the bit line 260 may not be decreased.

Figure 20:
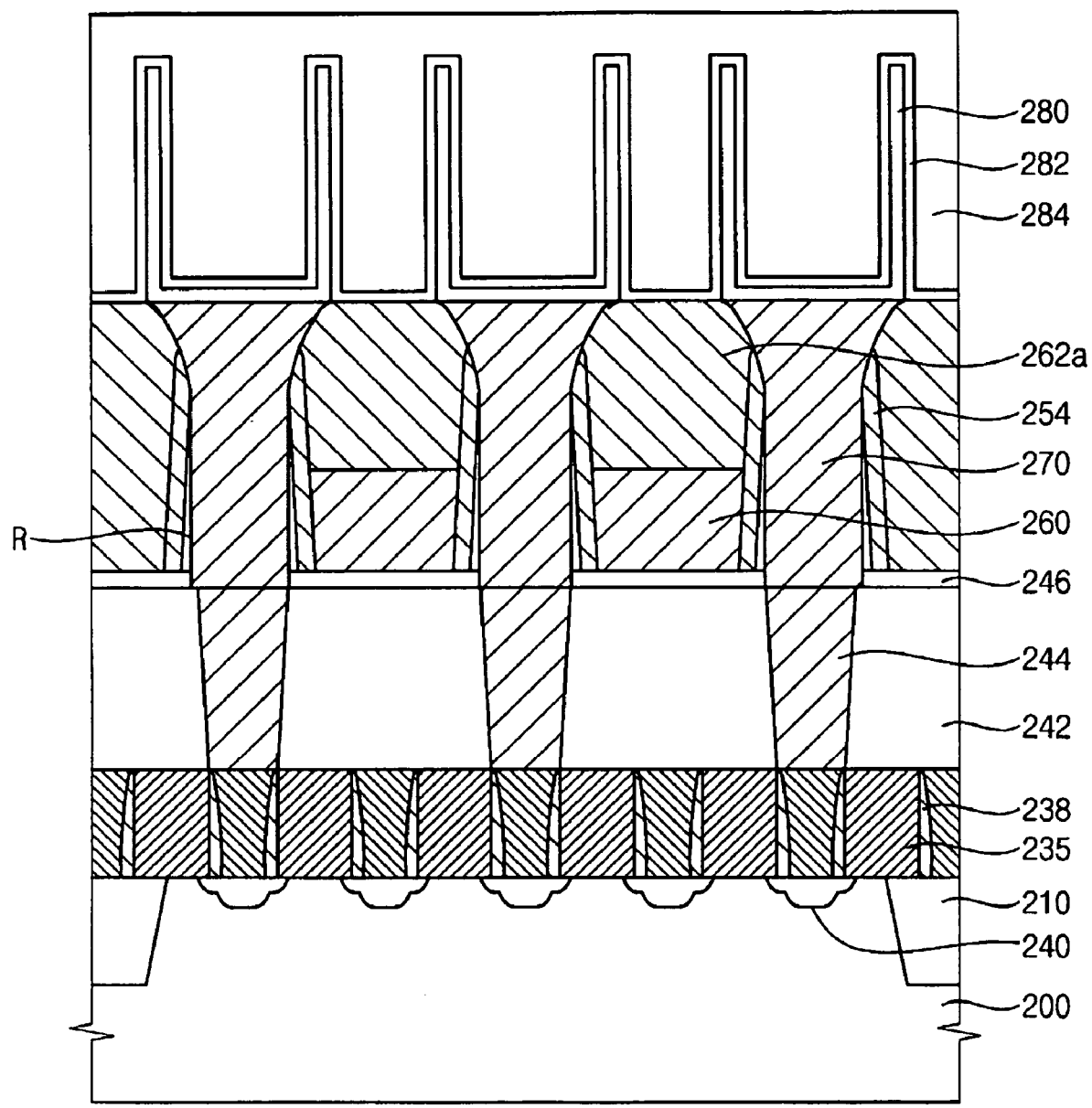

Referring to FIG. 20, a lower electrode 280 may be provided on the silicon substrate 200. The lower electrode 280 may be fabricated from polysilicon, for example. Alternatively, the lower electrode 280 may be fabricated from a metal such as tungsten, aluminum and/or copper, for example, and/or a metal nitride such as tungsten nitride, for example.

The lower electrode 280 may be fabricated by a CVD process, for example. The lower electrode 280 may have a cylindrical shape, for example, which may increase an effective area of a capacitor in the semiconductor device.

A dielectric layer 282 may be provided on the lower electrode 280. The dielectric layer 282 may be fabricated by an ALD process, for example. The dielectric layer 282 may be fabricated from a metal oxide, for example. The metal oxide may include aluminum oxide and/or hafnium oxide, for example.

When the dielectric layer 282 fabricated by the ALD process, the dielectric layer 282 may include an aluminum oxide layer and/or a hafnium oxide layer, for example.

An upper electrode 284 may be provided on the dielectric layer 282. The upper electrode 284 may be fabricated from polysilicon. Alternatively, the upper electrode 284 may be fabricated from a metal such as tungsten, aluminum and/or copper, for example, and/or a metal nitride such as tungsten nitride, for example. The upper electrode 284 may be fabricated by a CVD process, for example.

In this way, a capacitor, which may include the lower electrode 280, the dielectric layer 282 and the upper electrode 284, may be provided on the silicon substrate 200.

According to example, non-limiting embodiments of the present invention, an oxide layer pattern having a slope, a spacer, a bit line and a mask pattern may be provided on a substrate so that the spacer may not be damaged by etching process to provided a contact hole, and a residual portion of the oxide layer pattern may remain on a sidewall of the spacer at the lower portion of the contact hole.

Therefore, a shoulder margin of the spacer may become sufficiently large that a breakdown voltage may not decrease between a wiring formed in the contact hole and the bit line.

Furthermore, example embodiments may obviate a need to provide an additional insulation layer to fill up a space between the bit lines.

The foregoing is illustrative of example embodiments of the present invention and is not to be construed as limiting thereof. Although example embodiments of the invention have been described, those skilled in the art will readily appreciate that numerous and varied modifications may be suitably implemented without departing from the novel teachings and advantages of this invention. Accordingly, all such modifications are intended to be included within the spirit and scope of this invention as defined by the following claims.

What is claimed is:

1. A method comprising:
    providing a first insulation layer pattern on a substrate, the first insulation layer pattern including a first contact hole through which a first region of the substrate is exposed, the first contact hole having increased width versus height from the substrate;
    providing a spacer on a sidewall of the first insulation layer pattern;
    providing a conductive layer pattern in the first contact hole such that a top surface of the conductive layer pattern is lower than a top surface of the first insulation layer pattern;
    providing a second insulation layer pattern on the conductive layer pattern in the first contact hole;
    providing a second contact hole on the substrate by etching the first insulation layer pattern using the second insulation layer pattern and the spacer as a self-aligning mask, so that a portion of the first insulation layer pattern remains on a sidewall of the spacer, the second contact hole exposing a second region of the substrate; and
    providing a wiring in the second contact hole by filling the second contact hole with a conductive material, the wiring being electrically connected to the substrate.

2. The method of claim 1, wherein the first insulation layer pattern includes an oxide.

3. The method of claim 1, wherein the spacer includes a nitride.

4. The method of claim 1, wherein the second insulation layer pattern includes a nitride.

5. The method of claim 1, wherein the spacer has a second etching rate that is substantially identical to a third etching rate of the second insulation layer pattern.

6. The method of claim 1, wherein the first insulation layer pattern has a first etching rate that is about three times to about six times greater than a second etching rate of the spacer.

7. The method of claim 1, wherein the first insulation layer pattern has a first etching rate that is about three times to about six times greater than a third etching rate of the second insulation layer pattern.

8. The method of claim 1, wherein providing the spacer includes:
    providing a nitride layer on the substrate including the first insulation layer pattern; and
    anisotropically etching the nitride layer to provide the spacer on the sidewall of the first insulation layer pattern.

9. The method of claim 1, wherein providing the conductive layer pattern includes:
    providing a conductive layer on the substrate to fill up the first contact hole; and
    anisotropically etching the conductive layer.

10. The method of claim 1, wherein the conductive layer pattern is at least one of a polysilicon pattern and a tungsten pattern.

11. The method of claim 1, wherein providing the second contact hole includes:
- providing a photoresist pattern on the second insulation layer pattern such that the first insulation layer pattern and a peripheral portion of the second insulation layer pattern is exposed, the photoresist pattern defining a region in which the second contact hole is to be provided; and
- etching the first insulation layer pattern and the peripheral portion of the second insulation layer pattern using the photoresist pattern as an etching mask.

12. A method comprising:
- providing an oxide layer pattern having a first etching rate on a substrate including an insulating interlayer that covers a contact pad, the oxide layer pattern including a first contact hole, a width of a lower portion of the oxide layer pattern being greater than a width of an upper portion of the oxide layer pattern;
- providing a spacer on a sidewall of the oxide layer pattern, the spacer having a second etching rate lower than the first etching rate;
- providing a bit line on the insulating interlayer in the first contact hole such that a top surface of the bit line is lower than a top surface of the oxide layer pattern;
- providing a mask pattern on the bit line in the first contact hole, the mask pattern having a third etching rate lower than the first etching rate;
- providing a second contact hole through which the contact pad is exposed by sequentially etching the oxide layer pattern and the insulating interlayer using the spacer and the mask pattern as a self-aligning mask, so that a portion of the oxide layer pattern remains on a sidewall of the spacer around the bit line so that a width of a lower portion of the second contact hole is smaller than a width of a lower portion of the oxide layer pattern; and
- providing a wiring in the second contact hole by filling the second contact hole with a conductive material, the wiring being electrically connected to the contact pad.

13. The method of claim 12, further comprising providing a transistor on the substrate, the transistor including source/drain regions that are electrically connected to the contact pad, and a gate structure.

14. The method of claim 12, wherein an etching rate of the insulating interlayer is substantially identical to first etching rate of the oxide layer pattern.

15. The method of claim 12, wherein the second etching rate is substantially identical to the third etching rate.

16. The method of claim 12, wherein the first etching rate is about three times to six times greater than the second etching rate.

17. The method of claim 12, wherein the first etching rate is about three times to six times greater than the third etching rate.

18. The method of claim 12, wherein the spacer and the hard mask pattern are fabricated from a nitride.

19. The method of claim 12, wherein providing the mask pattern includes:
- providing a nitride layer on the bit line to fill up the first contact hole; and
- planarizing the nitride layer by a chemical mechanical polishing process until a top surface of the oxide layer pattern is exposed.

20. The method of claim 12, further comprising providing a capacitor on the substrate, the capacitor being electrically connected to the wiring.

21. A method comprising:
- providing a first insulation layer pattern on a substrate, the first insulation layer pattern including a first contact hole through which the substrate is exposed, the first contact hole having increased width versus height from the substrate;
- providing a spacer on a sidewall of the first insulation layer pattern;
- providing a conductive layer pattern in the first contact hole;
- providing a second insulation layer pattern in the first contact hole and on a top surface of the conductive layer pattern;
- etching the first insulation layer pattern using the second insulation layer pattern and the spacer as a self-aligning mask to provide a second contact hole through which the substrate is exposed, so that a portion of the first insulation layer pattern remains on a sidewall of the spacer; and
- filling the second contact hole with a conductive material, the conductive material being electrically connected to the substrate.

* * * * *